(12) United States Patent
Xie et al.

(10) Patent No.: US 10,504,790 B2
(45) Date of Patent: Dec. 10, 2019

(54) METHODS OF FORMING CONDUCTIVE SPACERS FOR GATE CONTACTS AND THE RESULTING DEVICE

(71) Applicant: GLOBALFOUNDRIES Inc., Grand Cayman (KY)

(72) Inventors: Ruilong Xie, Niskayuna, NY (US); Lars W. Liebmann, Halfmoon, NY (US); Bipul C. Paul, Mechanicville, NY (US); Daniel Chanemougame, Troy, NY (US); Nigel G. Cave, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 15/658,524

(22) Filed: Jul. 25, 2017

(65) Prior Publication Data

US 2019/0035692 A1     Jan. 31, 2019

(51) Int. Cl.
*H01L 21/82* (2006.01)
*H01L 21/8234* (2006.01)
*H01L 27/088* (2006.01)

(52) U.S. Cl.
CPC ........... *H01L 21/823468* (2013.01); *H01L 21/823418* (2013.01); *H01L 21/823431* (2013.01); *H01L 21/823437* (2013.01); *H01L 21/823475* (2013.01); *H01L 27/088* (2013.01)

(58) Field of Classification Search
CPC ..... H01L 21/823468; H01L 21/823418; H01L 21/823437; H01L 27/088
See application file for complete search history.

(56) References Cited

U.S. PATENT DOCUMENTS

| | | | | |
|---|---|---|---|---|
| 9,397,049 B1* | 7/2016 | Fan | ................... | H01L 21/76897 |
| 2009/0267137 A1* | 10/2009 | Choi | ................. | H01L 21/26586 257/324 |
| 2011/0101468 A1* | 5/2011 | Nakajima | ......... | H01L 21/28088 257/402 |
| 2012/0104512 A1* | 5/2012 | Horak | ................. | H01L 29/4983 257/401 |
| 2014/0349476 A1* | 11/2014 | Chen | ................. | H01L 21/76816 438/620 |
| 2015/0206754 A1* | 7/2015 | Horak | ............... | H01L 21/28008 257/288 |

* cited by examiner

*Primary Examiner* — Joseph C. Nicely
*Assistant Examiner* — Lamont B Koo
(74) *Attorney, Agent, or Firm* — Amerson Law Firm, PLLC

(57) ABSTRACT

A method includes forming a first gate structure above a first region of a semiconducting substrate. A first sidewall spacer is formed adjacent the first gate structure. The first gate structure and the first sidewall spacer are recessed to define a first gate contact cavity. A second sidewall spacer is formed in the first gate contact cavity. A first conductive gate contact is formed in the first gate contact cavity. The second sidewall spacer is removed to define a first spacer cavity. A conductive material is formed in the first spacer cavity to form a first conductive spacer contacting the first conductive gate contact.

19 Claims, 16 Drawing Sheets

US 10,504,790 B2

METHODS OF FORMING CONDUCTIVE SPACERS FOR GATE CONTACTS AND THE RESULTING DEVICE

BACKGROUND OF THE INVENTION

1. Field of the Invention

The present disclosure generally relates to the fabrication of integrated circuits, and, more particularly, to various methods of forming conductive spacers for gate contacts and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16, which is sometimes referred to as a "CB contact" structure, that is formed so as to establish electrical contact to the gate structure of the transistor device. As shown in FIG. 1B, the CB gate contact 16 is typically positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation (dielectric) layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric materials, have been formed above the substrate 12. Other layers of material, such as contact etch stop layers and the like, are not depicted in the attached drawings. Also depicted are illustrative raised epitaxial source/drain (S/D) regions 32 and source/drain contact structures 34 which typically include a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in an interlayer dielectric material. In other applications (not shown in FIG. 1B), the CA contact structures 14 may also be a line-type feature that contacts underlying line-type features, e.g., the TS structure 36 that contacts the source/drain region 20 (the TS structure 36 is a line-type feature that typically extends across the entire active region on the source/drain region 20 in a direction that is parallel to that of the gate structure 22). The TS structures 36, CA contacts 14 and the CB contact 16 are all considered to be device-level contacts within the industry.

In one embodiment, the process flow of forming the TS structures 36, CA contacts 14 and CB contacts 16 may be as follows. After the first layer of insulating material 30A is deposited, TS openings are formed in the first layer of insulating material 30A that expose portions of underlying source/drain regions 20. Thereafter, a traditional metal silicide region is formed through the TS openings, followed by forming tungsten (not separately shown) on the metal silicide regions, and performing a chemical mechanical polishing (CMP) process down to the top of the gate cap layer 24. Then, the second layer of insulating material 30B is deposited and contact openings for the CA contacts 14 are formed in the second layer of insulating material 30B that expose portions of the underlying tungsten metallization above the source/drain regions 20. Next, while the opening for the CA contacts 14 is masked, the opening for the CB contact 16 is formed in the second layer of insulating material 30B and through the gate cap layer 24 so as to expose a portion of the gate electrode 22B. Typically, the CB contact 16 may be in the form of a round or square plug. Thereafter, the conductive CA contacts 14 and the conductive CB contact 16 are formed in their corresponding openings in the second layer of insulating material 30B by performing one or more common metal deposition and CMP process operations, using the second layer of insulating material 30B as a polish-stop layer to remove excess conductive material positioned outside of the contact openings. The CA contacts 14 and CB contact 16 typically contain a uniform body of metal, e.g., tungsten, and may also include one or more metallic barrier layers (not shown) positioned between the uniform body of metal and the layer of insulating material 30B. As noted above, the source/drain contact structures 34, the CA contacts 14 and the CB contact 16 are all considered to be device-level contacts within the industry.

With continuing reference to FIG. 1A, a portion of the multi-level metallization system for the IC product 10 is depicted. More specifically, FIG. 1A depicts an illustrative example of a so-called M1 metallization layer of the multi-level metallization system. The M1 metallization layer is formed in a layer of insulating material 38, e.g., a low-k insulating material. The M1 metallization layer typically includes a plurality of metal lines 42 that are routed as needed across the IC product 10. A plurality of conductive vias—so-called V0 vias 40—are formed so as to establish electrical connection between the M1 metallization layer and the device-level contacts—CA contacts 14 and the CB contact 16. The metallization lines 42 are typically formed by forming long continuous trenches in the layer of insulating material 38 across substantially the entire substrate. Thereafter, these trenches are filled with one or more conductive materials and one or more chemical mechanical polishing (CMP) processes are performed to remove excessive conductive materials outside of the trenches.

FIG. 1B is a simplistic plan view of the illustrative transistor device 11 just showing the device level contacts—the CA contacts 14 and the CB contact 16—and their relative locations for the device 11. Also depicted in FIG. 1B is the gate cap layer 24, a sidewall spacer 26 and the trench silicide structures 36 formed above the source/drain regions 20. As noted above, the entire CB gate contact 16 is positioned vertically above the isolation region 13 that surrounds the product 10, i.e., the CB gate contact 16 is not positioned above the active region defined in the substrate 12. The CB gate contact 16 is typically positioned above the isolation region 13 so as to avoid or reduce the chances of creating an electrical short between the CB contact 16 and the TS structure 36, i.e., there is a minimum spacing 43 that must be maintained between these two structures according to various design rules in an attempt to prevent such electrical shorts. Unfortunately, there is an area penalty associated with the requirement that the CB contact 16 only be positioned above the isolation region 13. What is needed is a method for forming the CB gate contact 16 above the active region of the device so as to conserve valuable plot space on an integrated circuit product.

The present disclosure is directed to various methods of forming a gate contact for a transistor above the active region and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive spacers on a gate contact and the resulting device. One illustrative method disclosed includes, among other things, forming a first gate structure above a first region of a semiconducting substrate. A first sidewall spacer is formed adjacent the first gate structure. The first gate structure and the first sidewall spacer are recessed to define a first gate contact cavity. A second sidewall spacer is formed in the first gate contact cavity. A first conductive gate contact is formed in the first gate contact cavity. The second sidewall spacer is removed to define a first spacer cavity. A conductive material is formed in the first spacer cavity to form a first conductive spacer contacting the first conductive gate contact.

Another method includes, among other things, forming a plurality of gate structures above a semiconducting substrate. First sidewall spacers are formed adjacent each of the plurality of gate structures. The plurality of gate structures and the first sidewall spacers are recessed to define first gate contact cavities. Second sidewall spacers are formed in the first gate contact cavities. First conductive gate contacts are formed in the first gate contact cavities. A mask layer is formed above a first subset of the plurality of gate structures. The second sidewall spacers of a second subset of the plurality of gate structures not covered by the mask layer are removed to define first spacer cavities. A conductive material is formed in the first spacer cavities to form first conductive spacers contacting the first conductive gate contacts for the second subset of the plurality of gate structures.

One illustrative device disclosed includes, among other things, a first gate structure positioned above a semiconducting substrate, a first sidewall spacer positioned adjacent the first gate structure, a first conductive gate contact contacting the first gate structure, and a first conductive spacer contacting the first sidewall spacer and a sidewall of the first conductive gate contact.

BRIEF DESCRIPTION OF THE DRAWINGS

The disclosure may be understood by reference to the following description taken in conjunction with the accompanying drawings, in which like reference numerals identify like elements, and in which.

Figure 1A:
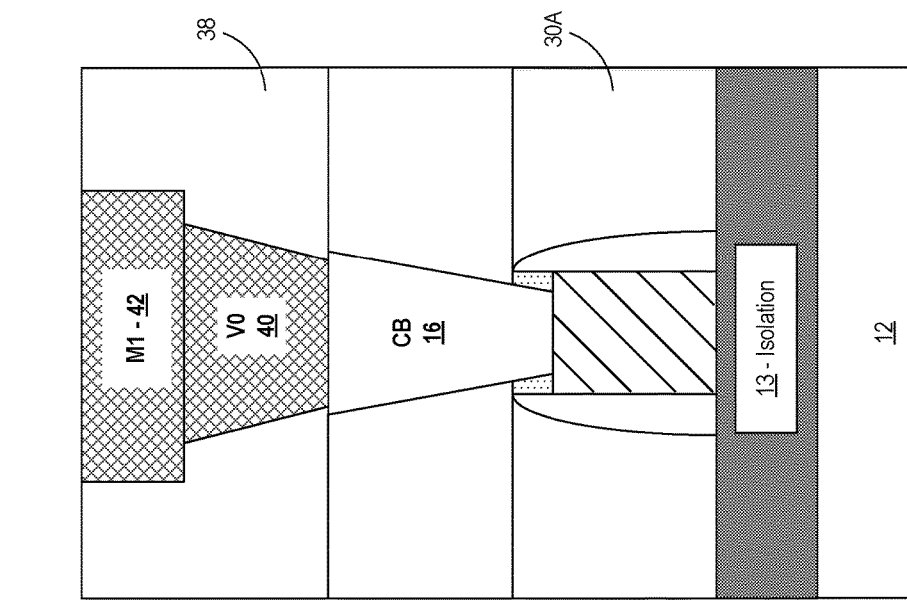
FIGS. 1A-1B depict various illustrative prior art arrangements of device-level contacts and metallization layers for an integrated circuit product.
Figure 1A:
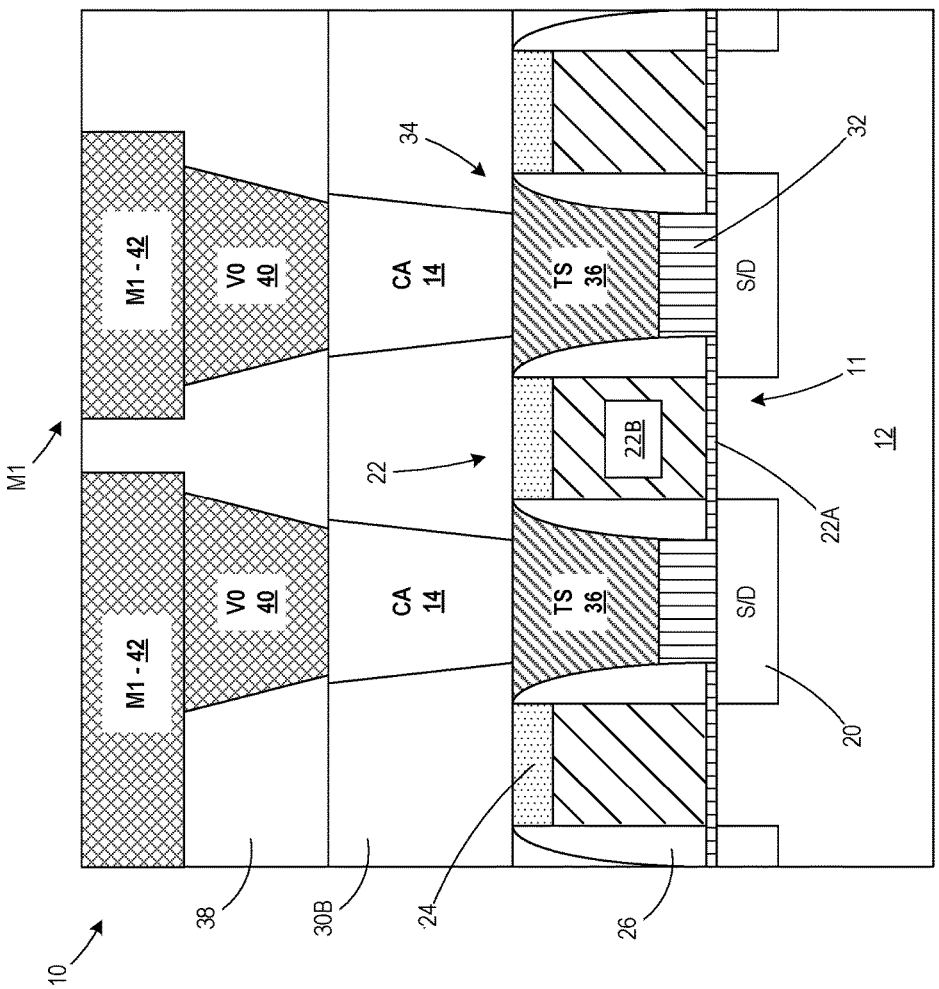
Figure 1B:
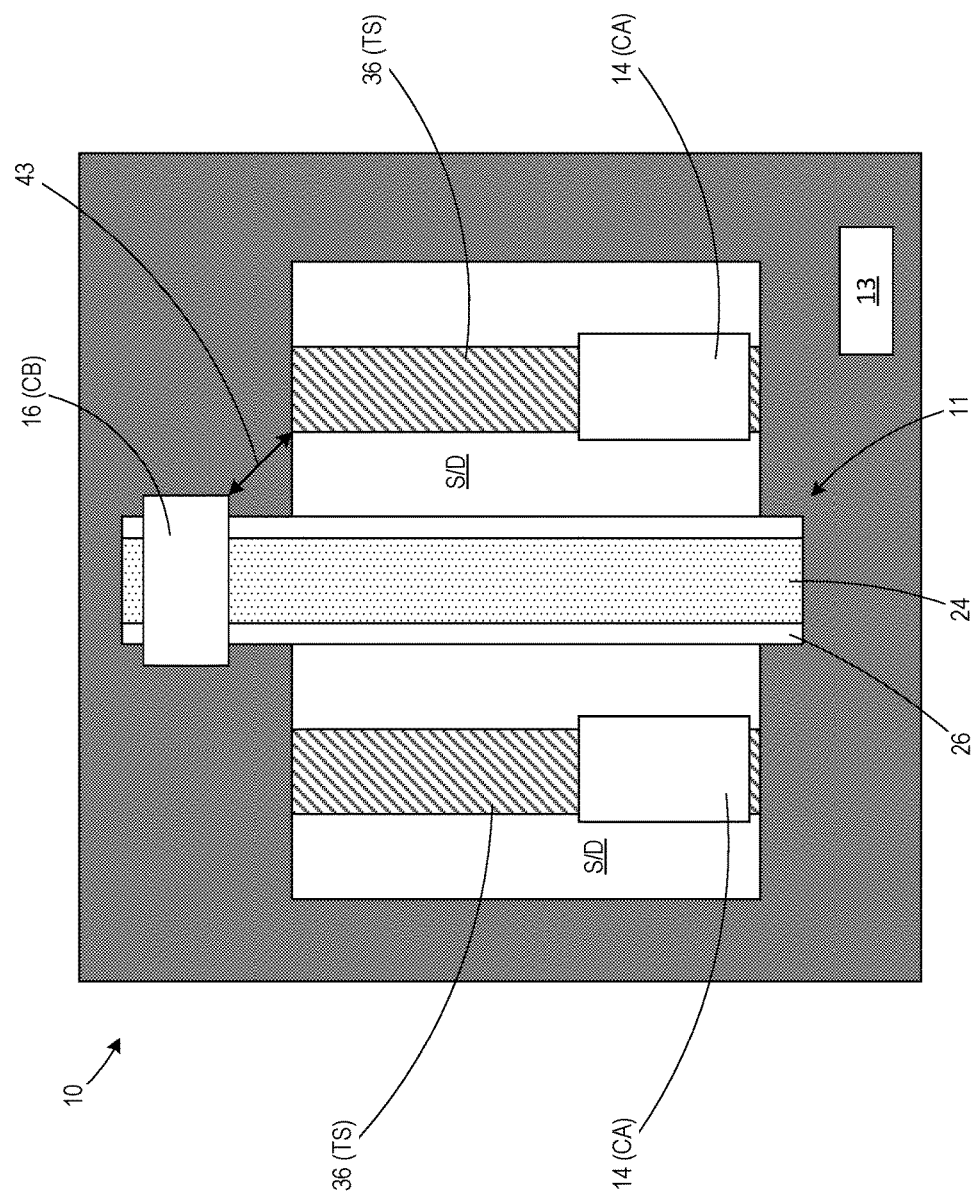

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a conductive gate contact structure (CB) for a transistor above an active region and the resulting device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
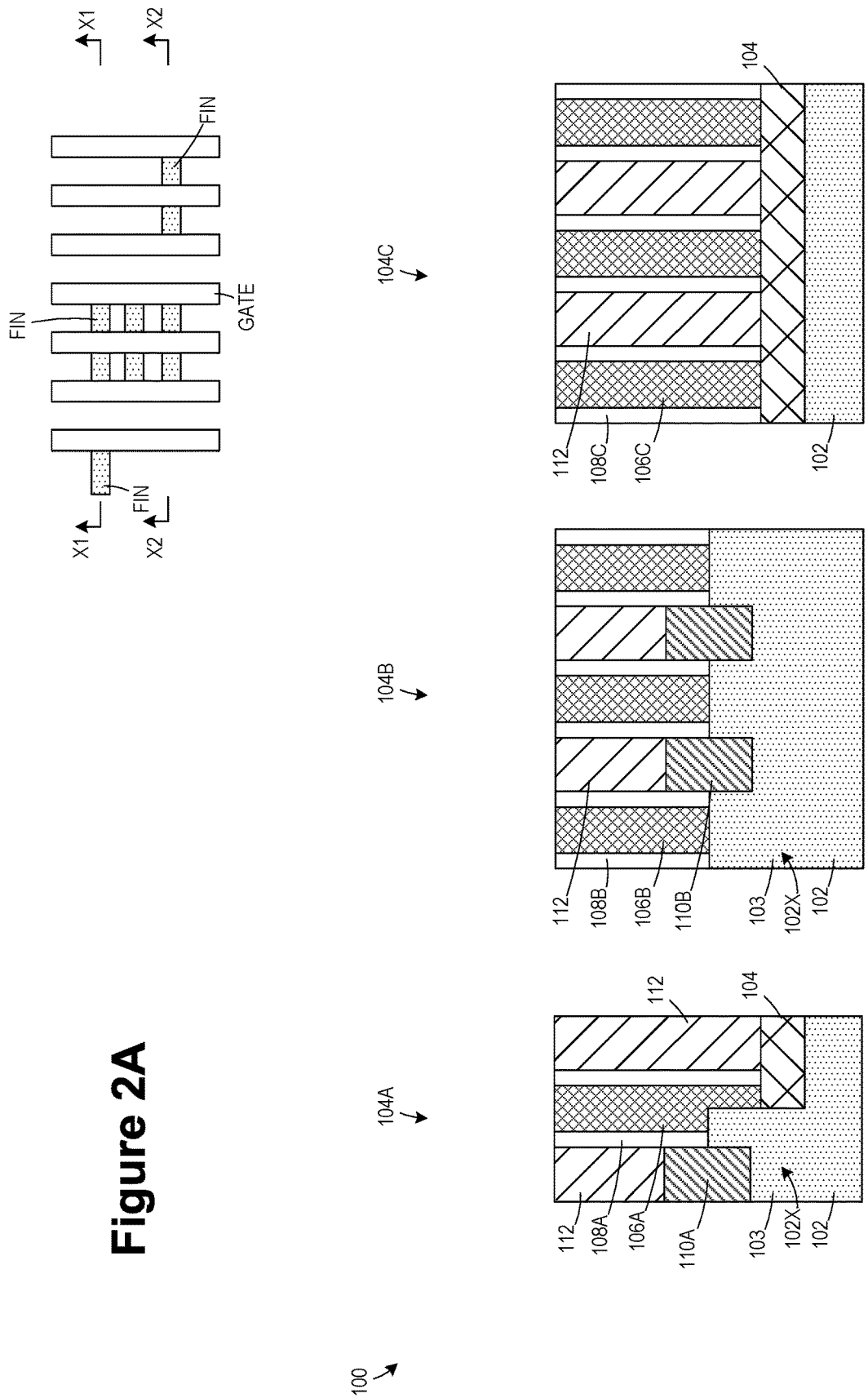
FIGS. 2A-2N depict various novel methods disclosed herein for forming a gate contact for a transistor above an active region and the resulting device.
Figure 2B:
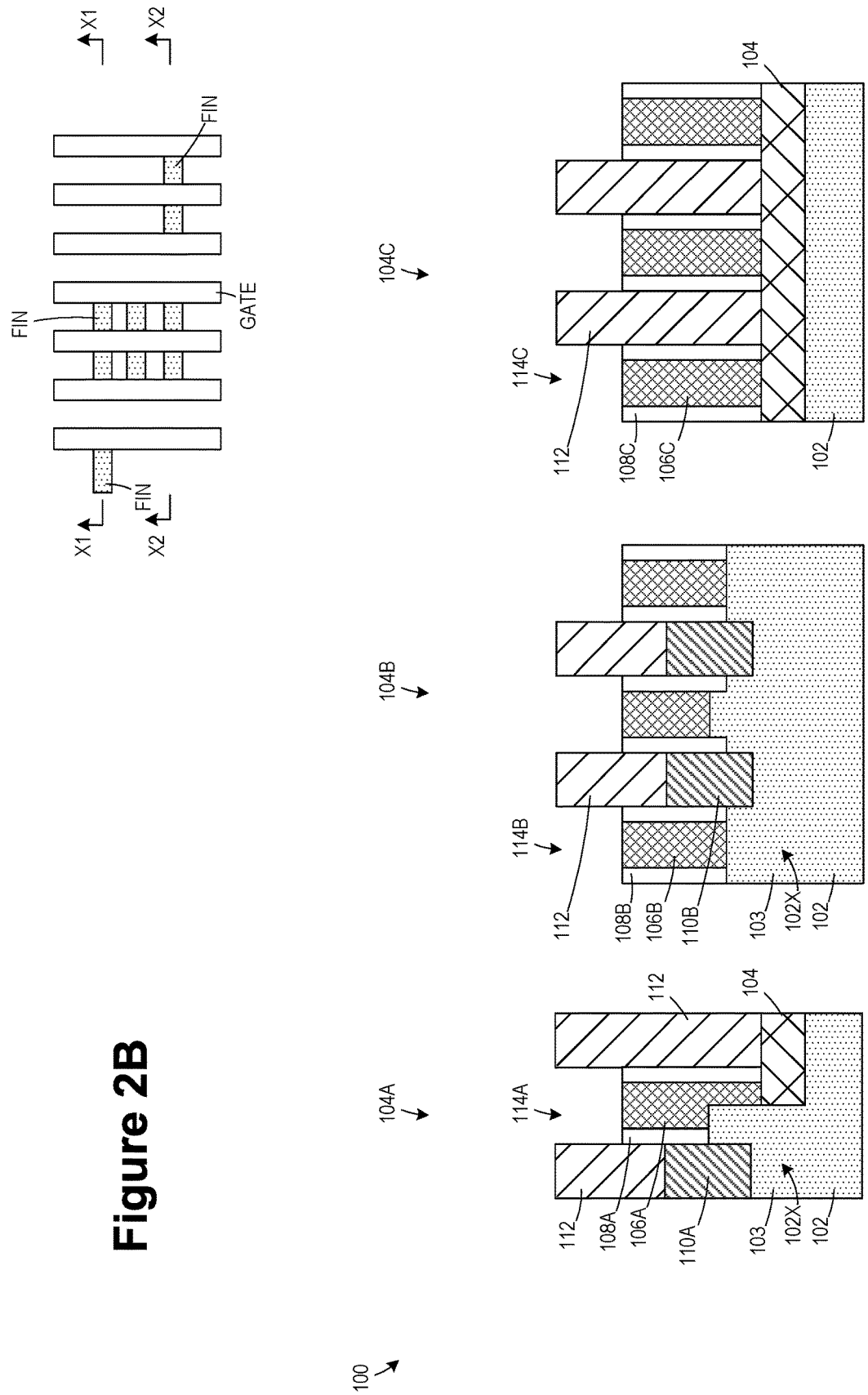
Figure 2C:
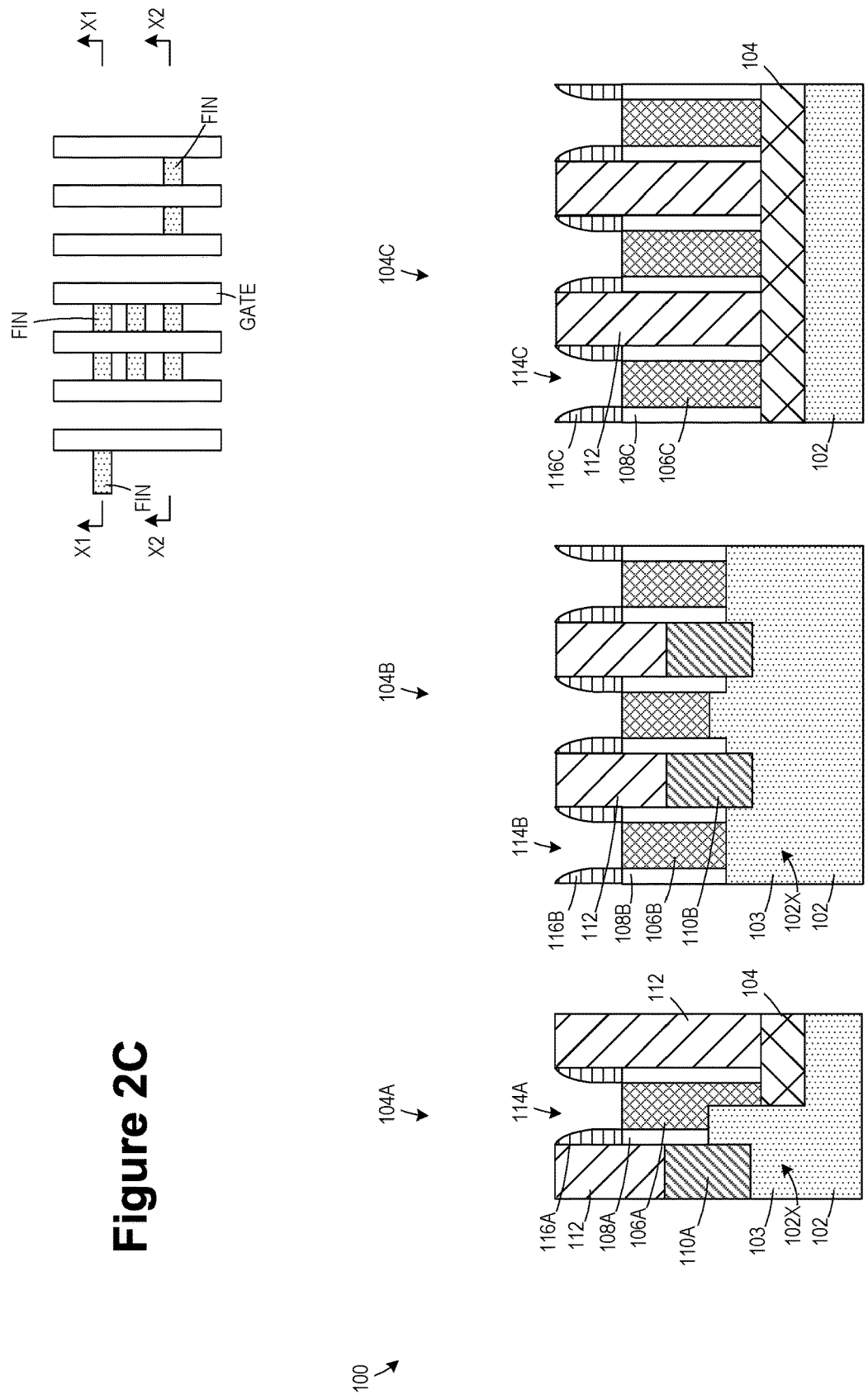
Figure 2D:
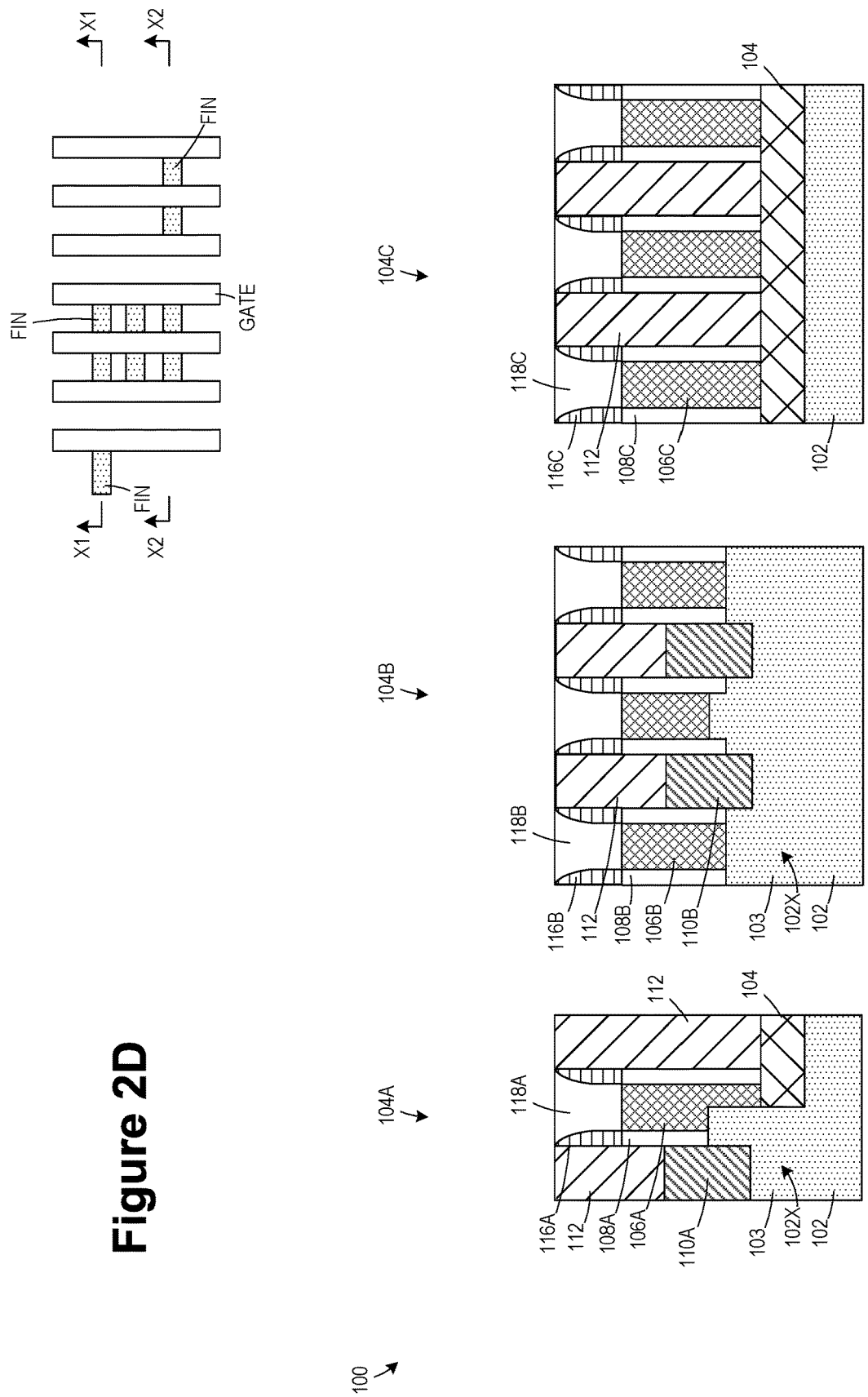
Figure 2E:
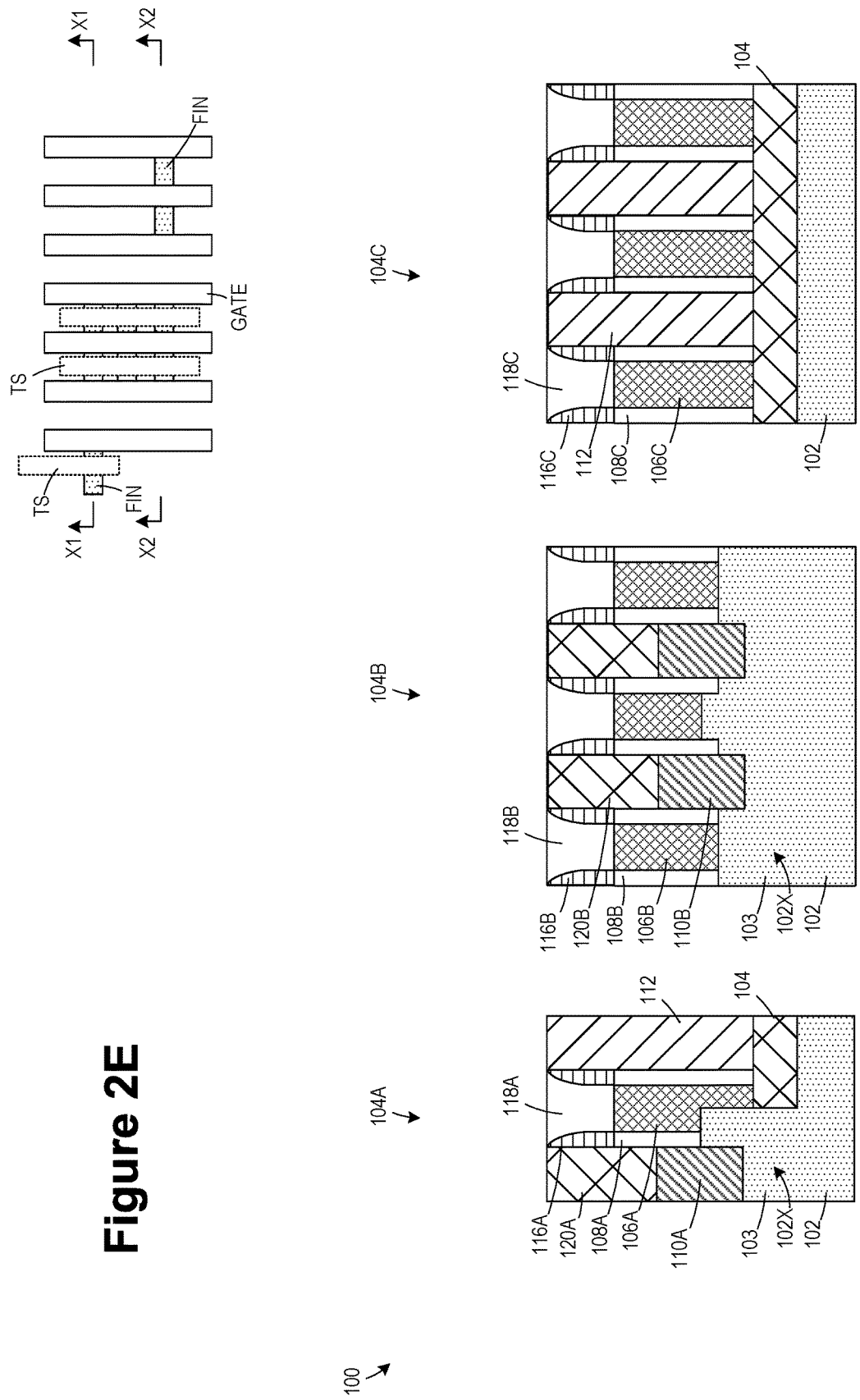
Figure 2F:
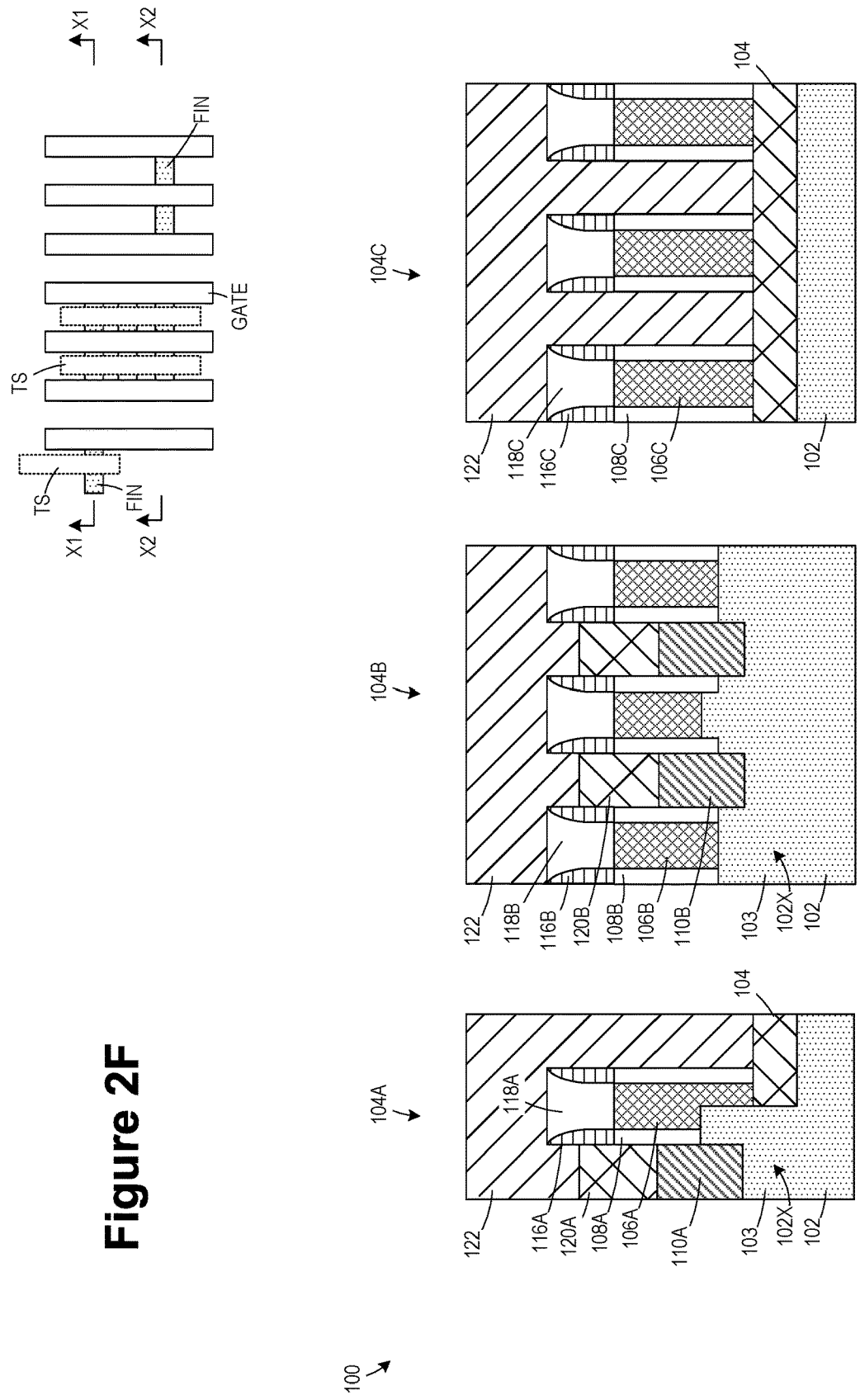
Figure 2G:
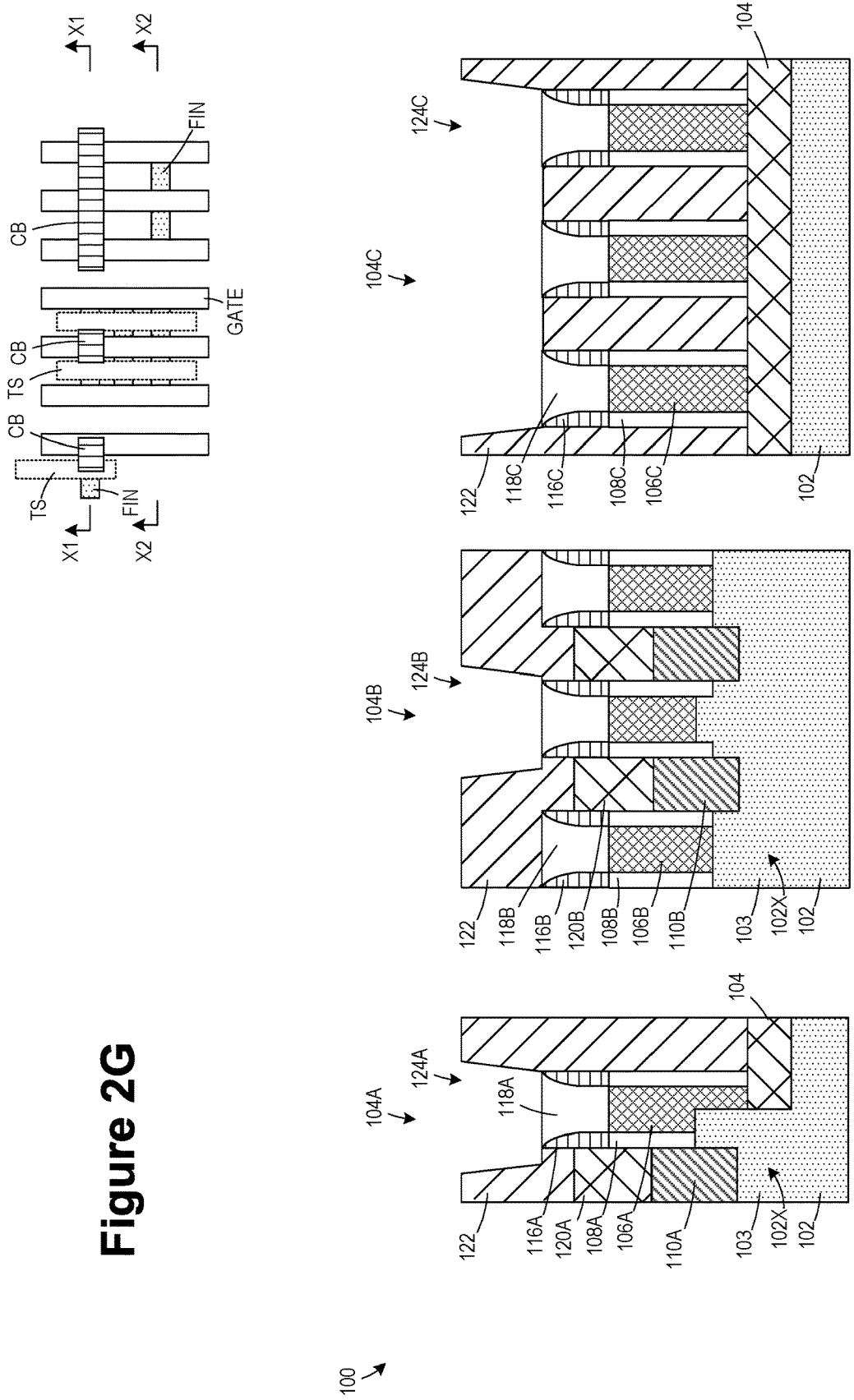
Figure 2H:
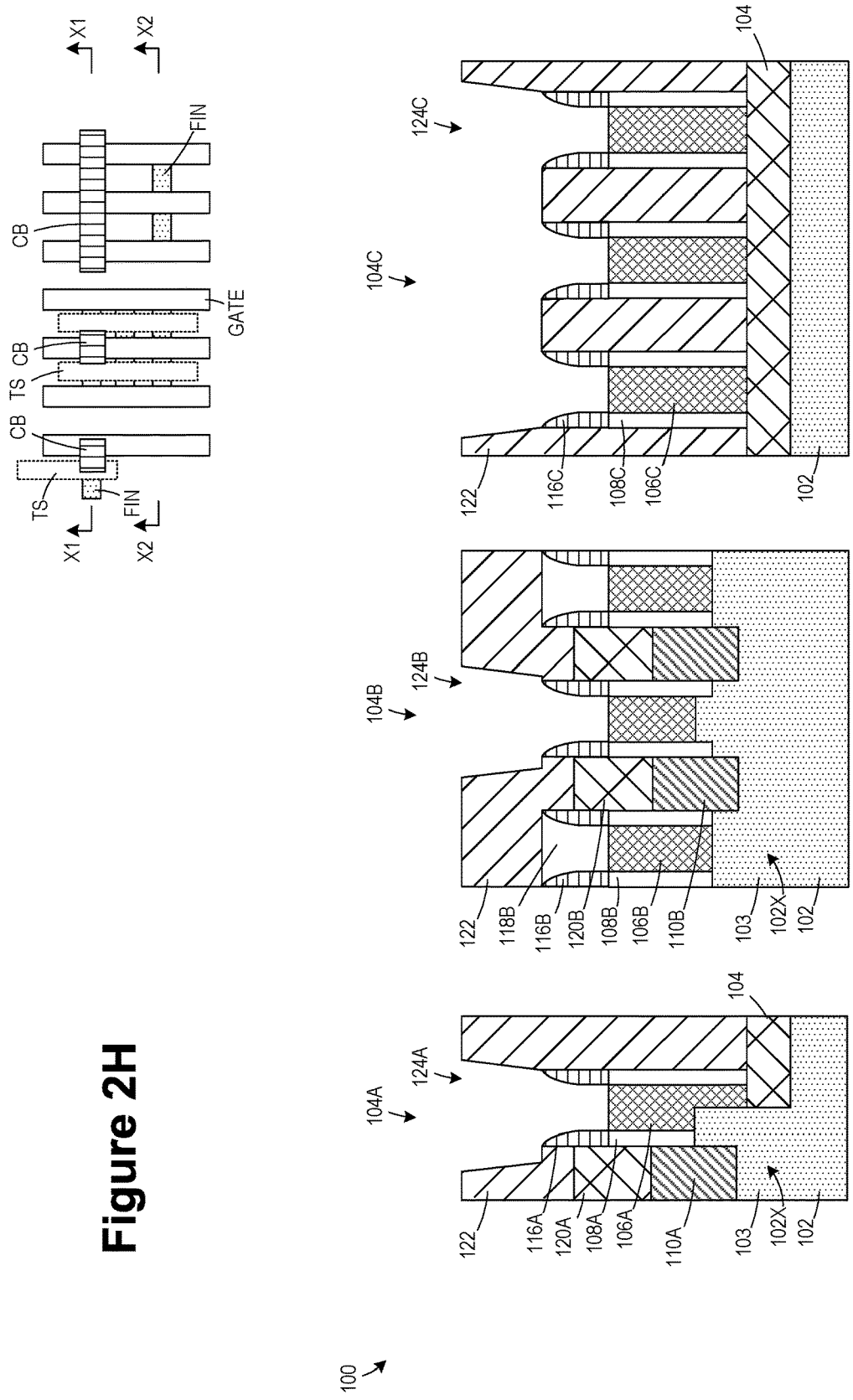
Figure 2I:
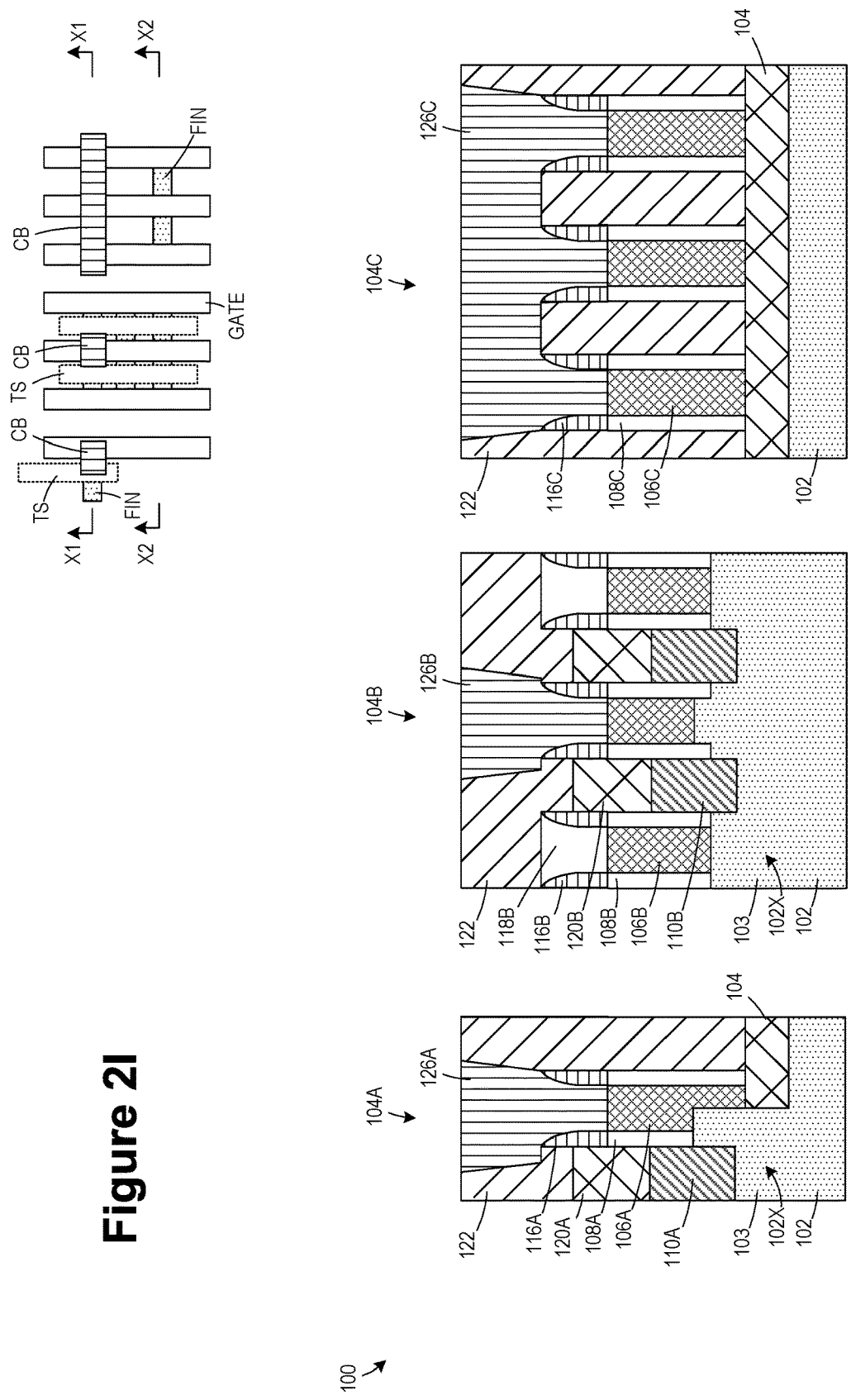
Figure 2J:
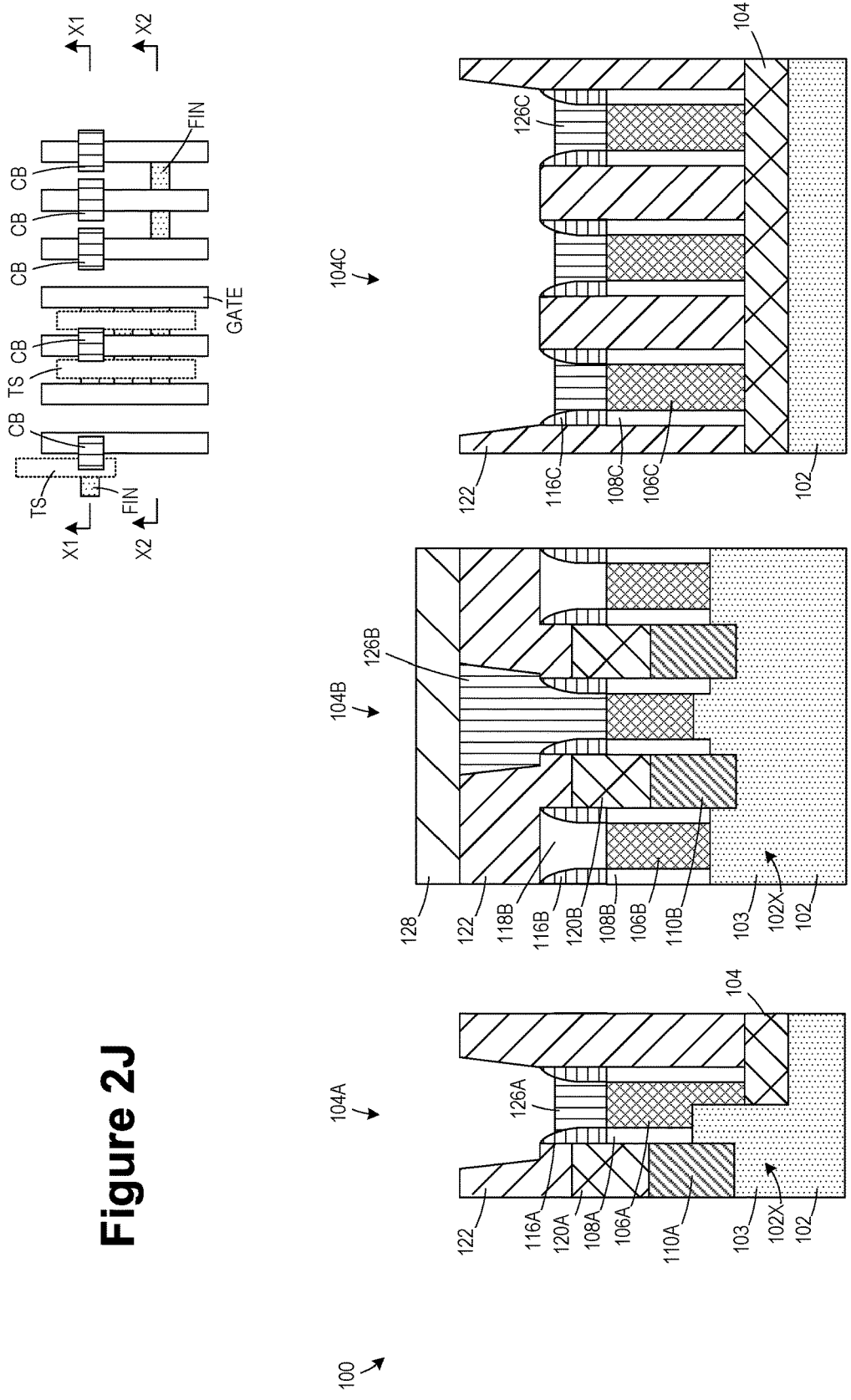
Figure 2K:
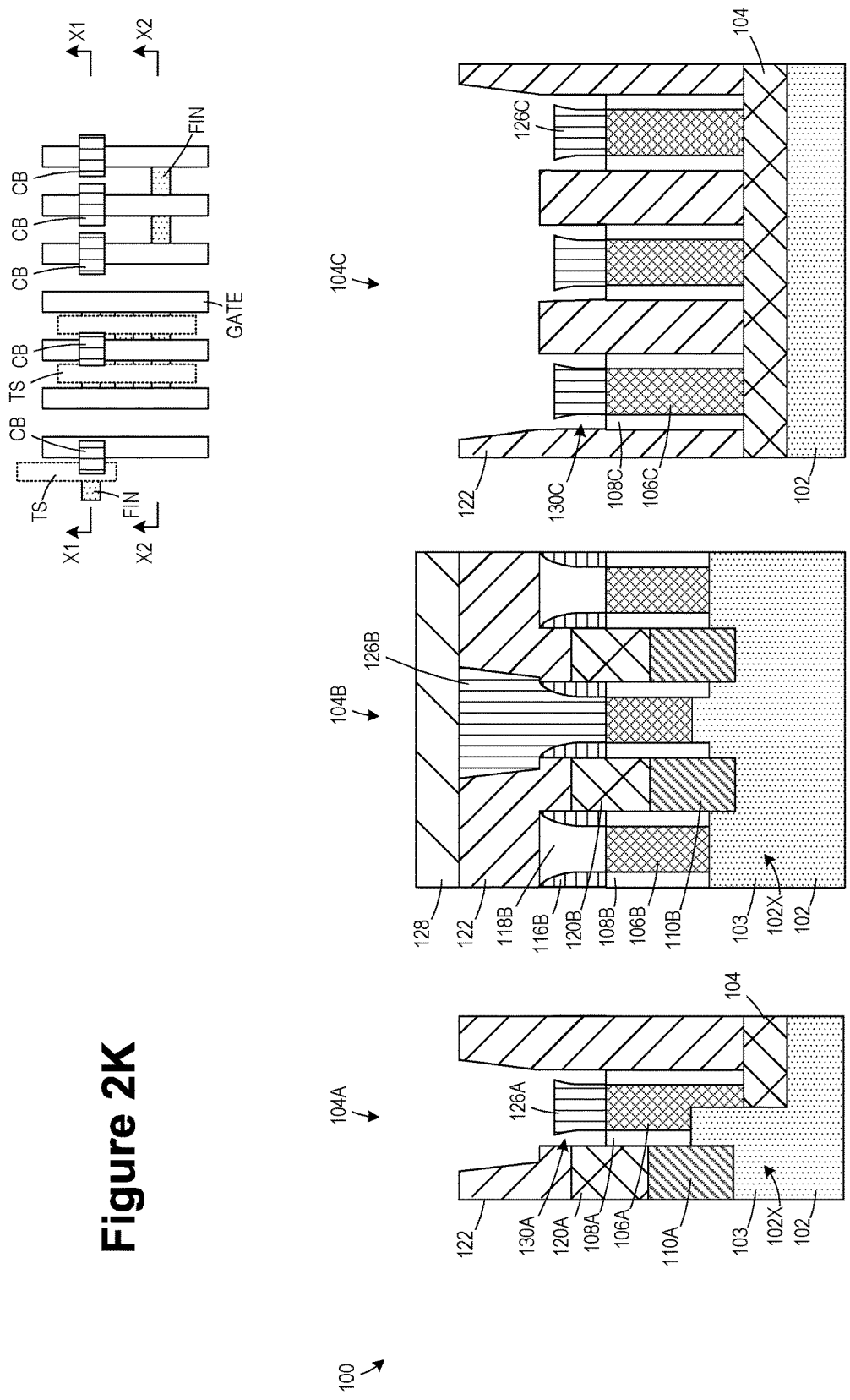
Figure 2L:
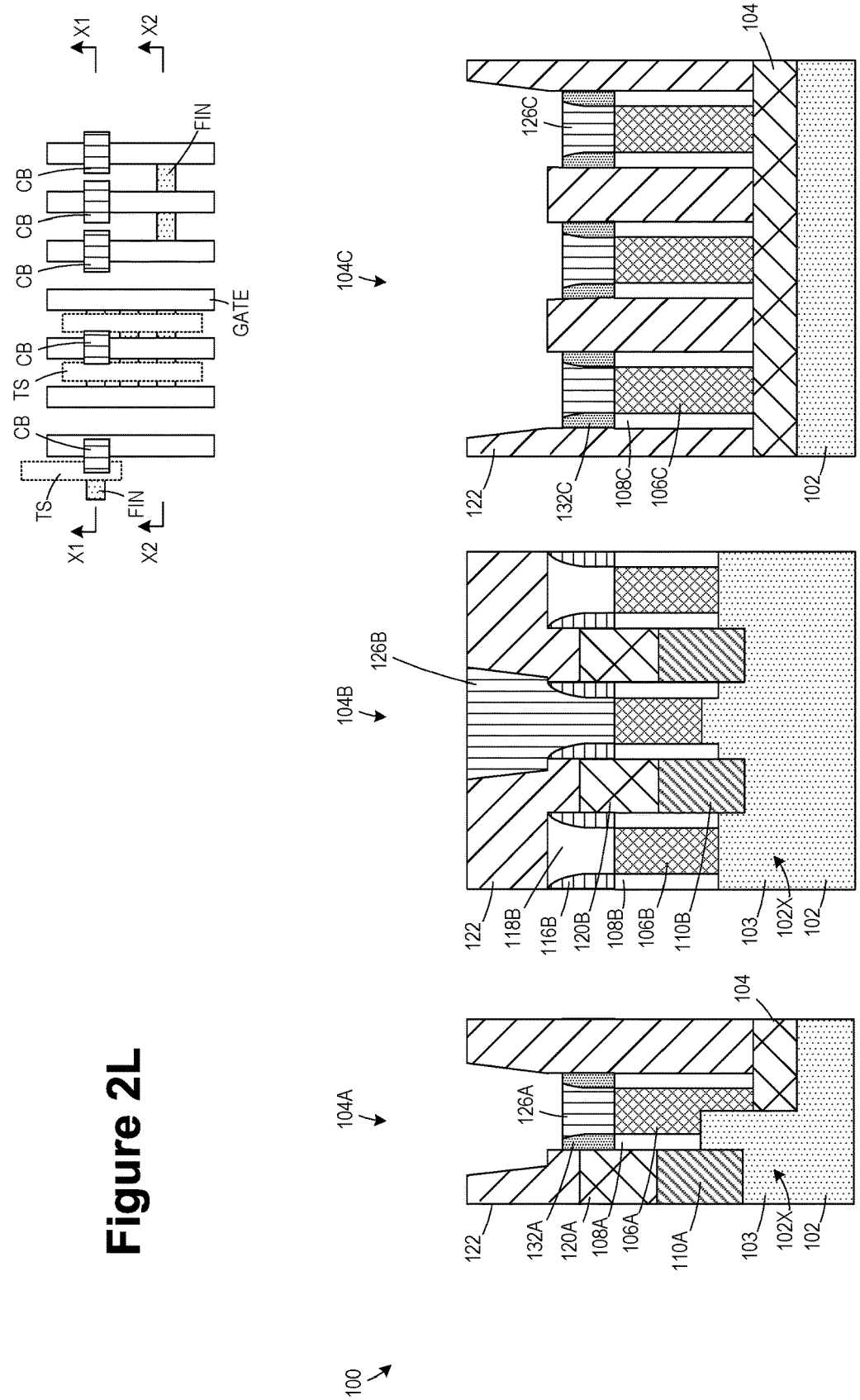
Figure 2M:
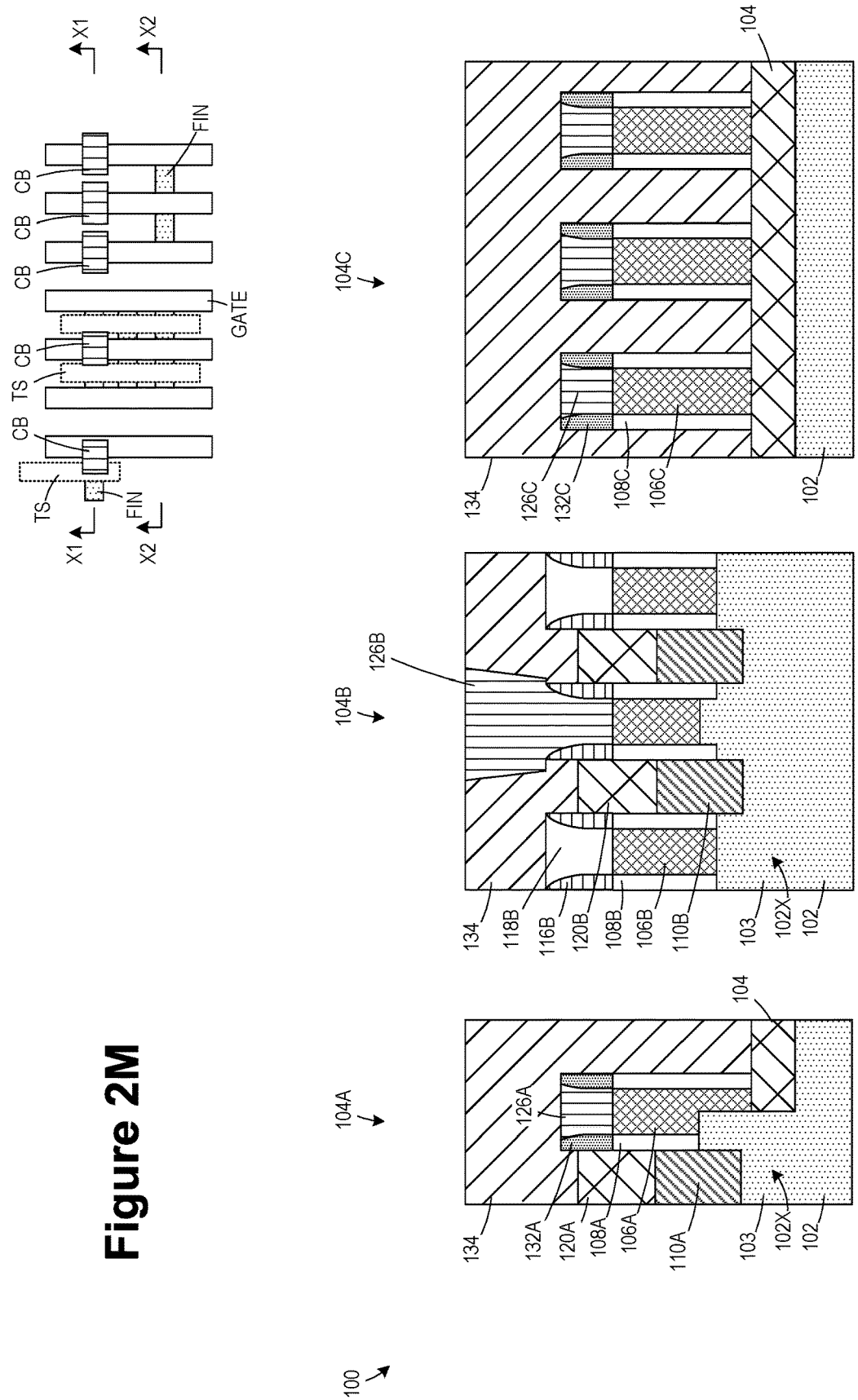
Figure 2N:
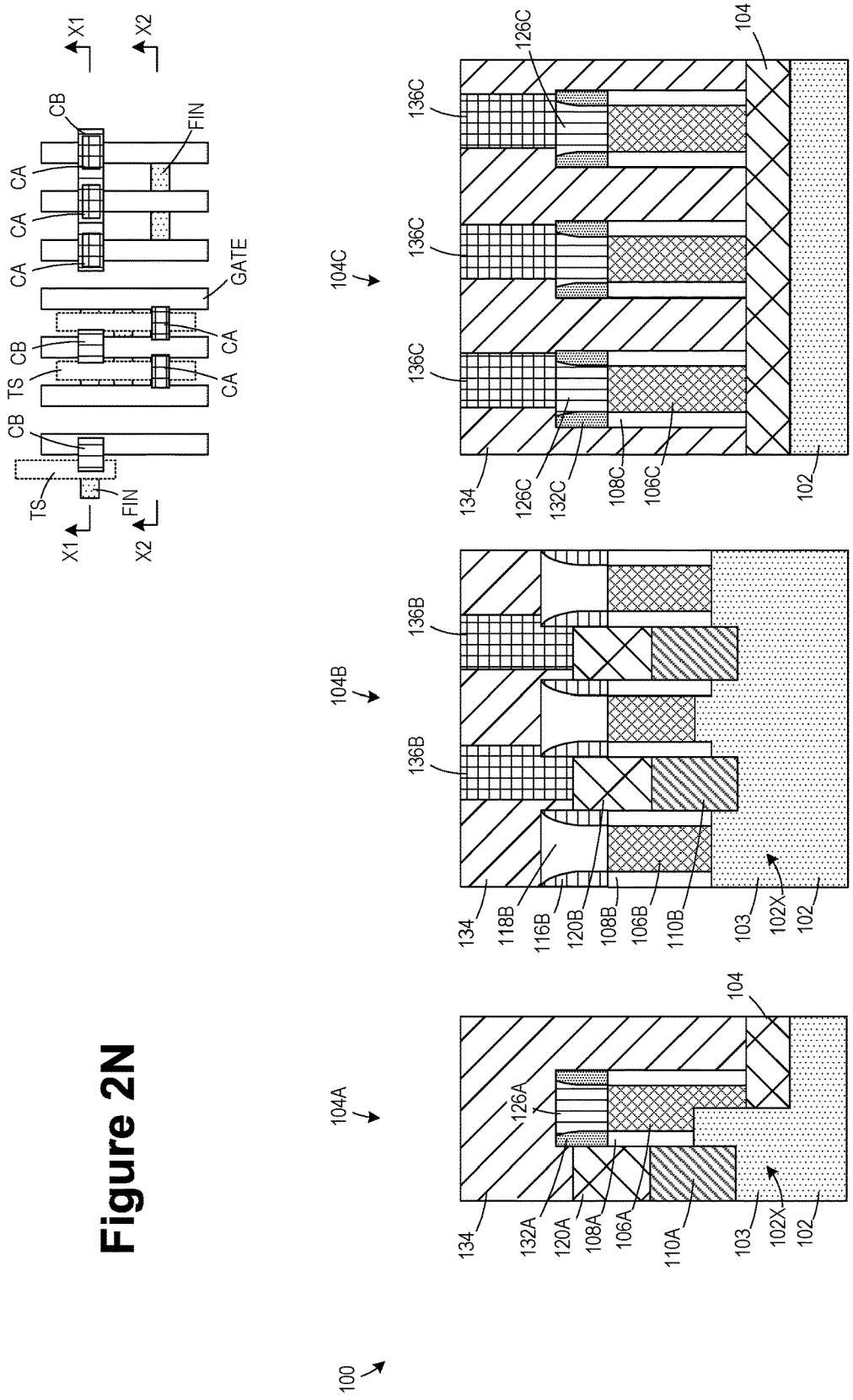

FIGS. 2A-2N depict various novel methods disclosed herein for forming conductive spacers on a gate contact structure (CB) for a transistor formed on an integrated circuit (IC) product 100. The product may include several different regions over which CB contacts may be formed. The figures contain a simplistic plan view showing where various cross-sectional views are taken in the drawings. The plan view depicts fins, gates, trench silicide (TS) source/drain contacts, gate contact structures (CB), and source/drain contact structures (CA) that will eventually be formed above a semiconductor substrate 102. As indicated in FIG. 2A, the views X1-X1 and X2-X2 are cross-sectional views taken through the device in a direction corresponding to a gate length direction of the device. Not all views are illustrated on each sheet of the figures. It should also be noted that, although some of the figures contain a plan view of the product 100, not all aspects of the processing shown in the cross-sectional views will be depicted in the plan view so as to not overly complicate the drawings.

With continuing reference to FIG. 2A, the illustrative IC product 100 will be formed in and above the semiconductor substrate 102. The substrate may have different regions over which CA and CB contacts may be formed, such as a CB cross-coupled region 104A (i.e., to provide gate to source/drain cross-coupling in an SRAM), a CB over active region 104B (i.e., high density region), and a CB over STI region 104C (i.e., lower density region). The product 100 may comprise either NMOS transistors, PMOS transistors or both types of transistors. The transistors may be of any desired configuration, e.g., FinFET devices, planar devices, etc. Additionally, various doped regions, e.g., halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein several process operations have been performed. First, an isolation region 104 was formed in the substrate 102 so as to define an active region (102X) where transistor devices may be formed. In the illustrated example, the active region 102X includes a plurality of fins. Next, a plurality of illustrative gate structures 106A, 106B, 106C were formed above the substrate 102 in the respective regions 104A, 104B, 104C. Each of the gate structures 106A, 106B, 106C includes sidewall spacers 108A, 108B, 108C. The sidewall spacers 108A, 108B, 108C were formed by performing a conformal deposition process to form a conformal layer of spacer material, e.g., silicon nitride, above the substrate 102 and thereafter performing an anisotropic etching process. The gate structures 106A, 106B, 106C each typically include a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The sidewall spacers 108A,108B, 108C are typically formed of silicon nitride. The gate structures 106A, 106B, 106C may be formed using well-known "gate first" or "replacement gate" manufacturing techniques. After the gate structures 106A, 106B, 106C and the spacers 108A, 108B, 108C were formed, an optional epitaxial semiconductor material 110A, 110B was formed in the source/drain regions of the transistor devices. The epitaxial semiconductor material 110A, 110B need not be formed in all embodiments. The physical size of the gate structures 106A, 106B, 106C and the gate pitch for the gate structures 106A, 106B, 106C may vary depending upon the particular application. Also depicted in FIG. 2A is a dielectric layer 112, e.g. low-k dielectric or silicon dioxide, that was deposited above the substrate 102 between the laterally spaced-apart gate structures 106A, 106B, 106C.

FIG. 2B depicts the product 100 after one or more etching processes were performed to recess the gate structures 106A, 106B, 106C and the spacers 108A, 108B, 108C selectively to the dielectric layer 112 to define cavities 114A, 114B, 114C.

FIG. 2C depicts the product 100 after several process operations were performed. Inner spacers 116A, 116B, 116C were formed in the cavities 114A, 114B, 114C above the recessed sidewall spacers 108A, 108B, 108C. A conformal layer of spacer material (e.g., silicon carbon oxide (SiCO)) was formed and an anisotropic etch process was performed to remove the horizontal portions of the conformal layer, resulting in the formation of the inner spacers 116A, 116B, 116C. The inner spacers 116A, 116B, 116C are formed of a different material than the spacers 108A, 108B, 108C to allow for a subsequent selective etch. The inner spacers 116A, 116B, 116C may have the same lateral thickness as the spacers 108A, 108B, 108C or they may have a different lateral thickness, depending on the thickness of the layer of spacer material.

FIG. 2D illustrates the product 100 after one or more processes were performed to form a cap layer 118A, 118B, 118C (e.g., silicon nitride) to fill the cavities 114A, 114B, 114C. A blanket deposition process followed by a planarization process may be performed to define the cap layer 118A, 118B, 118C.

FIG. 2E illustrates the product after one or more processes were performed to form trench silicide (TS) contacts 120A, 120B (e.g., metal silicide or combination of metal silicide and metal) above the epitaxial semiconductor material 110A, 110B that define the source/drain regions. The TS contacts 120A, 120B may also be referred to as source/drain (SD) contacts. An etch process using a patterned mask (not shown) was performed to remove the dielectric layer 112 above the epitaxial semiconductor material 110A, 110B to define cavities. One or more processes (e.g., cleaning, deposition, annealing, planarization, etc.) were performed to fill the cavities with conductive silicide material to define the TS contacts 120A, 120B. In one example, the TS contacts 120A, 120B are line-type structures that extend into and out of the drawing page in FIG. 2E that extend for substantially the entire length of the active region 102X (in a direction that corresponds to the gate width direction of the devices) in the region 104B.

FIG. 2F illustrates the product 100 after one or more processes were performed. An etch process was performed to recess the TS contacts 120A, 120B, and a deposition process was performed to form a dielectric layer 122 (i.e., illustrated as merging with the dielectric layer 112) above the recessed TS contacts 120A, 120B and the cap layers 118A, 118B, 118C.

FIG. 2G illustrates the product 100 after one or more processes were performed to pattern CB cavities 124A, 124B, 124C in the dielectric layer 122. A patterning stack (e.g., OPL, photoresist, BARC, etc.—not shown) was formed above the dielectric layer 122 and patterned to define openings corresponding to the CB cavities 124A, 124B, 124C. An etch process was performed through the patterned openings to define the CB cavities 124A, 124B, 124C.

FIG. 2H illustrates the product 100 after one or more etch processes were performed to selectively remove the exposed portions of the cap layers 118A, 118B, 118C.

FIG. 2I illustrates the product 100 after one or more processes (e.g., deposition and planarization) were performed to form CB contacts 126A, 126B, 126C (e.g., tungsten or some other conductive metal or material) in the CB cavities 124A, 124B, 124C.

FIG. 2J illustrates the product 100 after a patterned mask 128 (e.g., OPL, photoresist, BARC, etc.) was formed above the CB contact 126B and an etch process was performed to recess the CB contacts 126A, 126C. The patterned mask 128 prevents recessing of the CB contact 126B.

FIG. 2K illustrates the product 100 after an etch process was performed to remove the inner spacers 116A, 116C, thereby defining spacer cavities 130A, 130C. Since the inner spacers 116A, 116C are made of a different material than the spacers 108A, 108C, the etch may be selective.

FIG. 2L illustrates the product 100 after one or more processes were performed. An ashing process was performed to remove the mask 128. A deposition process (e.g., atomic layer deposition) was performed to form conductive spacers 132A, 132C (e.g., TiN, ALD, W, Ru, etc.) in the spacer cavities 130A, 130C. An etch back process was performed to reduce the height of the conductive material to approximately the same height as the CB contacts 126A, 126C.

FIG. 2M illustrates the product 100 after a deposition process was performed to form a dielectric layer 134 (i.e., illustrated as merging with the dielectric layer 122) above the recessed TS contacts 120A, 120B and the cap layers 118A, 118B, 118C.

FIG. 2N illustrates the product 100 after several processes were performed to form CA contacts 136B, 136C in the dielectric layer 134. A patterned etch process was performed to define CA openings in the dielectric layer 134 exposing the TS contacts 120B in the region 104B and the combined structure defined by the CB contacts 126C and the conductive spacers 132C.

The conductive spacer 132A provides gain to source/drain cross-connect by coupling the CB contact 126A (i.e., coupled to the gate structure 106A) to the TS contact 120A (i.e., coupled to the the source/drain epitaxial material 110A). The conductive spacers 132C provide a wider landing region for the CA contacts 136C to interface with the CB contacts 126C. Because the region 104B was masked during the process steps for forming the conductive spacers 132A, 132C, the CB contact 126B (see FIG. 2M) may be formed over the active region, thereby reducing the unit cell size. These different goals for the different regions 104A, 104B, 104C are achieved in an integrated process flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first gate structure above a first region of a semiconducting substrate;
    forming a first sidewall spacer adjacent said first gate structure;
    forming a first dielectric layer adjacent said first sidewall spacer;
    recessing said first gate structure and said first sidewall spacer to define a first gate contact cavity;
    forming a second sidewall spacer in said first gate contact cavity;
    forming a first conductive gate contact in said first gate contact cavity;
    removing said second sidewall spacer after forming said first conductive gate contact to expose an upper surface of said first sidewall spacer and define a first spacer cavity between said first dielectric layer and said first conductive gate contact; and
    forming a conductive material in said first spacer cavity to form a first conductive spacer contacting said first conductive gate contact and said upper surface of said first sidewall spacer, wherein said first sidewall spacer covers an entire sidewall of said first gate structure after said conductive material is formed.

2. The method of claim 1, further comprising:
    forming a first gate cap layer in said first gate contact cavity;
    forming a second dielectric layer above said first gate cap layer;
    forming a second gate contact cavity in said second dielectric layer so as to thereby expose said first gate cap layer;
    removing said first gate cap layer; and
    forming said first conductive gate contact after removing said first gate cap layer.

3. The method of claim 2, wherein forming said first conductive gate contact further comprises forming said first conductive gate contact in said first and second gate contact cavities, and the method further comprises:
    recessing said first conductive gate contact to expose at least a portion of said second sidewall spacer; and
    removing said second sidewall spacer after recessing said first conductive gate contact.

4. The method of claim 3, further comprising:
    forming a third dielectric layer above said first conductive gate contact and said first conductive spacer; and
    forming a second conductive gate contact in said third dielectric layer contacting said first conductive gate contact.

5. The method of claim 4, wherein said second conductive gate contact contacts at least a portion of said first conductive spacer.

6. The method of claim 3, further comprising:
    forming a first source/drain (SD) region adjacent said first gate structure; and
    forming a first SD contact contacting said first SD region, wherein said first conductive spacer contacts said first SD contact and said first gate contact.

7. The method of claim 1, further comprising:
    forming said first dielectric layer above said first gate structure; and
    planarizing said first dielectric layer to expose said first gate structure and said first sidewall spacer prior to recessing said first gate structure and said first sidewall spacer, wherein said first gate contact cavity is defined in said first dielectric layer.

8. A method, comprising:
    forming a plurality of gate structures above a semiconducting substrate;
    forming first sidewall spacers adjacent each of said plurality of gate structures;
    forming a first dielectric layer adjacent said first sidewall spacers;
    recessing said plurality of gate structures and said first sidewall spacers to define first gate contact cavities;
    forming second sidewall spacers in said first gate contact cavities;
    forming first conductive gate contacts in said first gate contact cavities;
    forming a mask layer above a first subset of said plurality of gate structures;
    removing said second sidewall spacers of a second subset of said plurality of gate structures not covered by said mask layer after forming said first conductive gate contact to expose an upper surface of said first sidewall spacers and to define first spacer cavities between said first dielectric layer and said first conductive gate contacts; and
    forming a conductive material in said first spacer cavities to form first conductive spacers contacting said first conductive gate contacts and said upper surfaces of said first sidewall spacers for said second subset of said plurality of gate structures, wherein said first sidewall spacers cover entire sidewalls of said first gate structures after said conductive material is formed.

9. The method of claim 8, further comprising:
    forming first gate cap layers in said first gate contact cavities;
    forming said first dielectric layer above said first gate cap layers;
    forming second gate contact cavities in said first dielectric layer so as to thereby expose said first gate cap layers;
    removing said first gate cap layers; and
    forming said first conductive gate contacts after removing said first gate cap layers.

10. The method of claim 8, wherein forming said first conductive gate contacts further comprises forming said first conductive gate contacts in said first and second gate contact cavities, wherein said mask layer is formed above said first conductive gate contacts of said first subset of said plurality of gate structures.

11. The method of claim 10, further comprising:
    recessing said first conductive gate contacts of said second subset of said plurality of gate structures to expose at least a portion of said second sidewall spacers; and
    removing said second sidewall spacers after recessing said first conductive gate contacts.

12. The method of claim 11, further comprising:
    forming a second dielectric layer above said first conductive gate contacts and said first conductive spacers; and
    forming second conductive gate contacts in said second dielectric layer contacting said first conductive gate contacts for said second subset of said plurality of gate structures.

13. The method of claim 12, wherein said second conductive gate contacts contact at least a portion of said first conductive spacers.

14. The method of claim 12, further comprising:
forming first source/drain (SD) regions adjacent said plurality of gate structures;
forming first SD contacts contacting said first SD region, wherein said first conductive spacers in said second subset of the plurality of gate structures contacts said first SD contacts and said first gate contacts.

15. The method of claim 8, wherein said first subset of said plurality of gate structures is formed above an active region, and said second subset of said plurality of gate structures is formed above an isolation region outside said active region.

16. The method of claim 8, further comprising:
forming said first dielectric layer above said plurality of gate structures; and
planarizing said first dielectric layer to expose said first gate structures and said first sidewall spacers prior to recessing said first gate structures and said first sidewall spacers, wherein said first gate contact cavities are defined in said first dielectric layer.

17. A device, comprising:
a first gate structure positioned above a semiconducting substrate;
a first sidewall spacer positioned adjacent said first gate structure;
a first conductive gate contact contacting said first gate structure and an upper surface of said first sidewall spacer;
a first conductive spacer contacting said first sidewall spacer and a sidewall of said first conductive gate contact, wherein said first conductive spacer does not contact said first gate structure;
a second gate structure positioned above said semiconducting substrate;
a second sidewall spacer positioned adjacent said second gate structure;
a second conductive gate contact contacting said second gate structure and an upper surface of said second sidewall spacer; a first source/drain (SD) region positioned adjacent said second gate structure;
a first SD contact contacting said first SD region; and
a second conductive spacer contacting said second sidewall spacer and a sidewall of said first conductive gate contact, wherein said first conductive spacer contacts said first SD contact and said first gate structure.

18. The device of claim 17, further comprising an active region defined in said semiconductor substrate by an isolation structure, wherein said first conductive gate structure is formed above said isolation structure outside said active region.

19. The device of claim 17, further comprising:
a dielectric layer positioned above said first conductive gate contact; and
a second conductive gate contact positioned in said dielectric layer, wherein said second conductive gate contact contacts said first conductive gate contact and at least a portion of said first conductive spacer.

* * * * *